United States Patent [19]
Ushikawa

[11] Patent Number: 5,378,283
[45] Date of Patent: Jan. 3, 1995

[54] TREATING DEVICE

[75] Inventor: Harunori Ushikawa, Kofu, Japan

[73] Assignee: Tokyo Electron Kabushiki Kaisha, Tokyo, Japan

[21] Appl. No.: 159,587

[22] Filed: Dec. 1, 1993

[30] Foreign Application Priority Data

Dec. 4, 1992 [JP] Japan ................... 4-325109

[51] Int. Cl.$^6$ .......................................... C23C 16/00
[52] U.S. Cl. ............................... 118/719; 118/715; 118/722; 118/725; 414/217; 414/938
[58] Field of Search ............... 118/719, 715, 722, 725; 414/217, 938

[56] References Cited

U.S. PATENT DOCUMENTS 4,883,020 11/1989 Kasai ..................... 118/719
5,303,671 4/1994 Kondo ..................... 118/719

FOREIGN PATENT DOCUMENTS 63-262470 10/1988 Japan ..................... 118/719

Primary Examiner—Richard Bueker
Attorney, Agent, or Firm—Beveridge, DeGrandi, Weilacher & Young

[57] ABSTRACT

A treating device of the closed system structure in which semiconductor wafers are conveyed from a load lock chamber to a process tube comprises a gas feed pipe for feeding inert gas into a load lock chamber, and a gas circulating cleaning system which lets out the inert gas in the load lock chamber, removes gaseous impurity and particulate impurities in the let out gas by a gas cleaning filter, and returns the cleaned gas into the load lock chamber. Thus, ambient atmosphere of the inert gas in the load lock chamber can be maintained at high purity, a consumption amount of the inert gas can be small, which contributes to suppression of generation of particles and preclusion of chemical contamination. The treating device can have high achievement and can be economical.

9 Claims, 2 Drawing Sheets

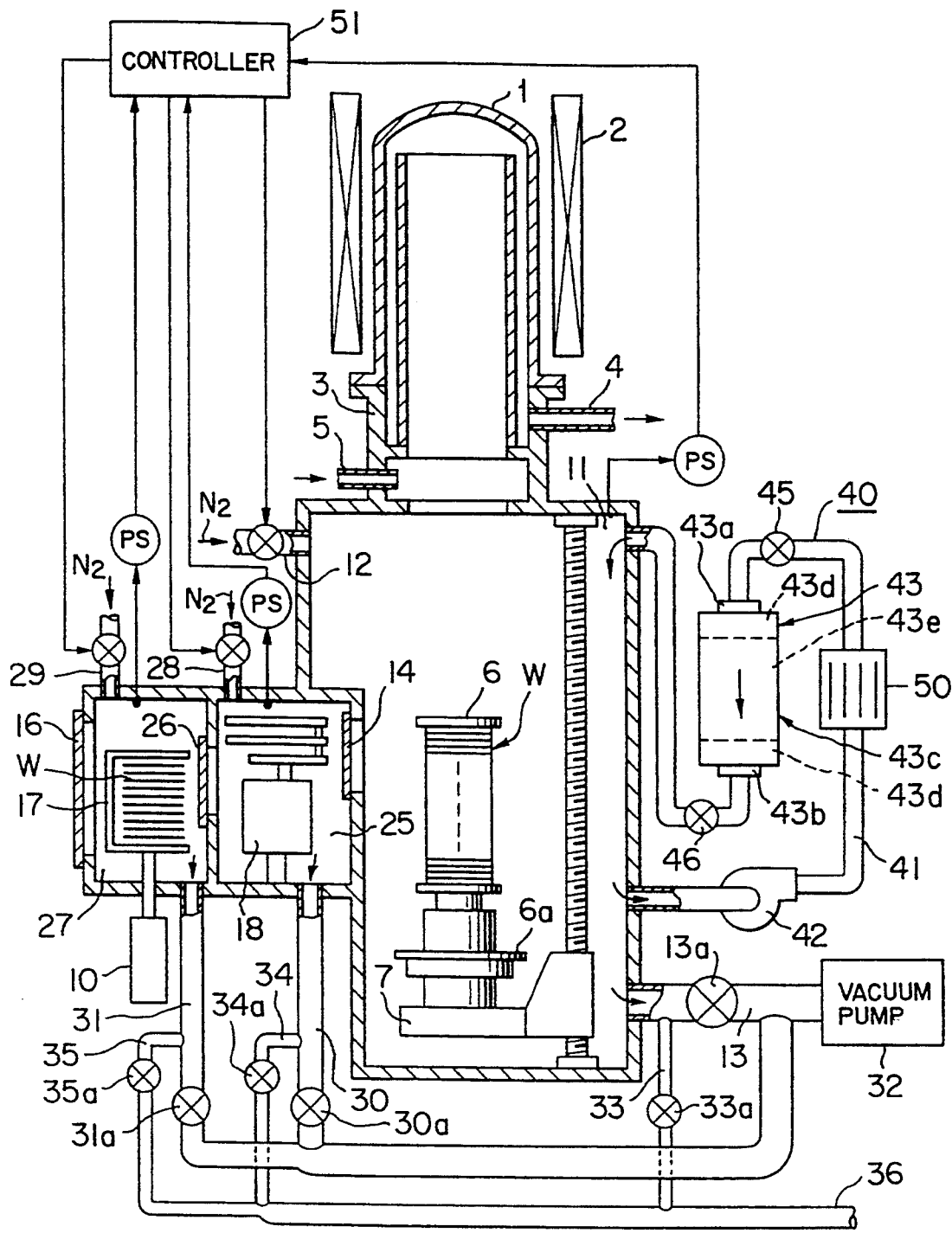
F I G. 1

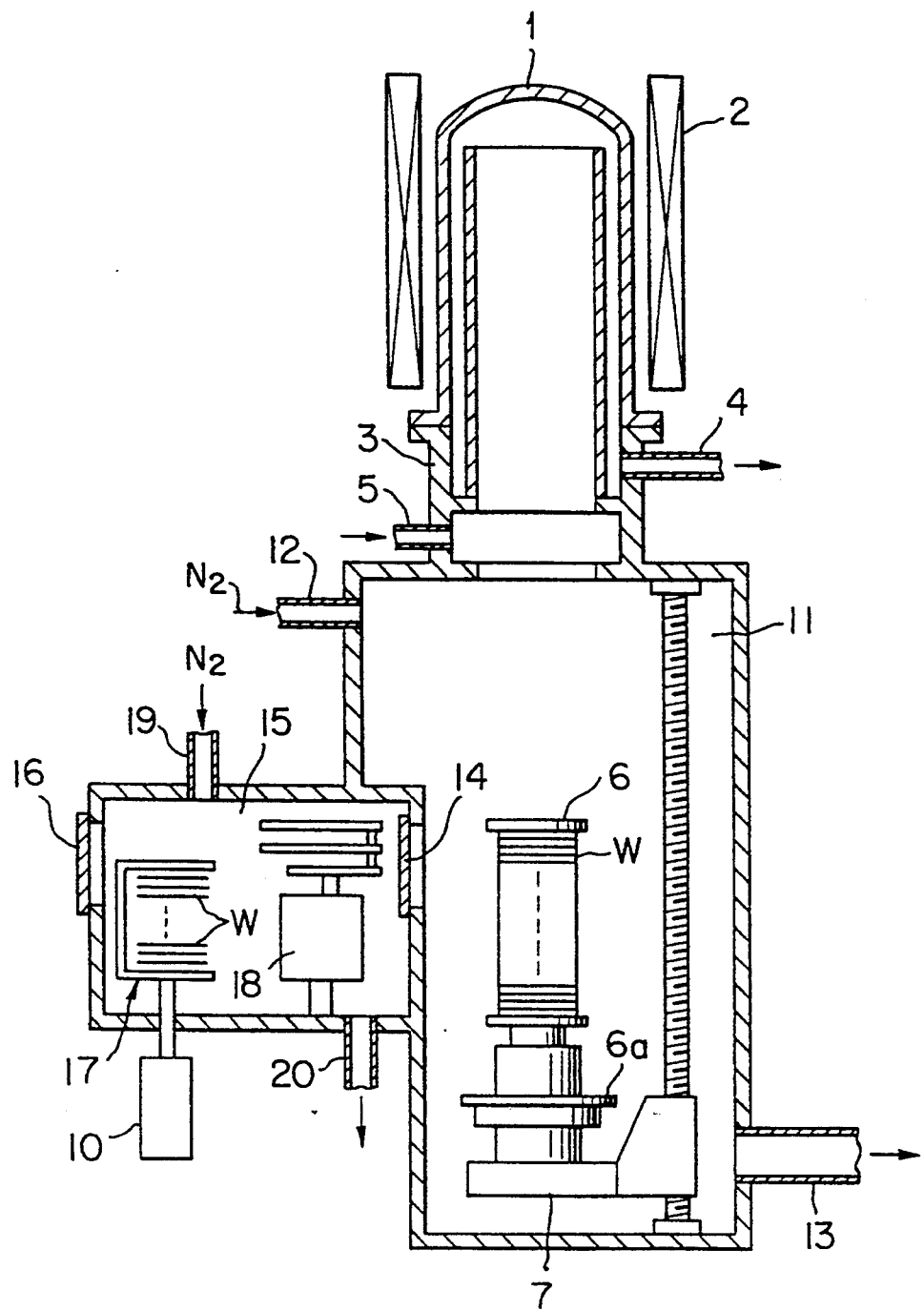
F I G. 2

TREATING DEVICE

BACKGROUND OF THE INVENTION

This invention relates to a treating device to be used in fabrication processes of, e.g., semiconductor devices.

A conventional treating device will be explained by means of a vertical heat treating device used in fabricating processes of semiconductor devices. In the vertical heat treating device semiconductor wafers to be treated are loaded on a wafer boat into a vertical process tube as a treatment chamber from below, and the interior of the process tube is heated under ambient atmosphere of set treatment gases to subject the semiconductor wafers to various treatments.

The vertical heat treating device of this type is used in, e.g., forming oxide films on semiconductor wafers, forming thin films by heat CVD, and forming heavily doped regions by heat diffusion.

FIG. 2 is a vertical sectional view of the conventional vertical heat treating device which schematically shows the structure thereof.

As shown in FIG. 2, the treatment chamber is provided by the process tube 1. The process tube 1 is a vessel of reverse U-shaped vertical section formed of, e.g., quartz. That is, the process tube 1 has a vertical cylindrical shaped having the top closed. A heater 2 is provided around the outside circumferential wall of the process tube 1.

A manifold 3 is connected to the lower end portion of the process tube 1. In the circumferential wall of the manifold 3 there are provided a gas feed pipe 5 for feeding fresh treatment gases into the process tube, and an exhaust pipe 4 for discharging gas from the process tube 2.

In a load lock chamber 11 directly below the manifold 3, a wafer boat 6 with a flange 6a is disposed vertically movably by a boat elevator 7. The wafer boat 6 holds a plurality (e.g., 120 sheets) of semiconductor wafers W on a plurality of vertically spaced shelves. The wafer boat 1 is lifted into and lowered out of the process tube 1 by the boat elevator 7. When the wafer boat 6 is lifted into the process tube 1, the flange 6a on the lower end of the wafer boat 6 closes the lower end of the manifold 3 to make the interior of the process tube 1 tightly closed. FIG. 2 shows a situation of the wafer boat lowered out of the process tube 1.

In this vertical heat treating device, semiconductor wafers W to be treated are held on the wafer boat 6, and the wafer boat holding the semiconductor wafers is lifted into the process tube 1 as the treatment chamber by the boat elevator 7 and closes the interior of the process tube 1 by the flange 6a. In this state, ambient atmospheric gas in the process tube 1 is evacuated through the exhaust pipe 4 to exhaust the gas, and when the interior of the process tube 1 reaches a set vacuum degree, set treatment gases are fed into the process tube through the gas feed pipe 5 and heated by the heater to subject the semiconductor wafers to required treatment.

In such treatment operation of semiconductor wafers, when the semiconductor wafers W are lifted on the wafer boat 6 into the process tube 1, or when the semiconductor wafers W is lowered out of the process tube 1 after a treatment, the semiconductor wafers W are placed in considerably high temperature ambient atmosphere on their way to and from the process tube 1. Accordingly it is a problem that if air is present there, natural oxide films are adversely formed on the surfaces of the semiconductor wafers W by $O_2$ in the air. In view of this, it is preferable that the load and unload of the wafer boat 6 is conducted in the closed system structure (separated from atmospheric air) in ambient atmosphere of inert gas (non-oxygen atmosphere), such as $N_2$ gas or others.

To give the device a closed system structure, a tightly sealed load lock chamber 11 is provided continuously on the lower end of the manifold 3 on the lower portion of the process tube 1 as the treatment chamber. In the load lock chamber 11, the wafer boat 6 and the boat elevator 7 are housed. A gas feed pipe 12 for feeding $N_2$ gas as gas feeding means is provided in an upper portion of the load lock chamber 11, and an exhaust pipe 13 is provided in a lower portion of the load lock chamber 11.

A vacuum chamber 15 is connected to the load lock chamber 11 through a gate valve 14. A wafer carrier 17 can be inserted into and out of the vacuum chamber 15 through an outside shutter 16 by a lift mechanism 10. In the vacuum chamber 15 there is provided a carrier mechanism (robot) for conveying the semiconductor wafers W housed in the wafer carrier 17 into or out of the wafer boat 6 in the load lock chamber 11 through the gate valve 14. The vacuum chamber 15 is also provided with a gas feed pipe 19 for feeding $N_2$ gas in the top thereof and an exhaust pipe 20 in the bottom thereof.

In such closed system structure vertical heat treating device, gas in the load lock chamber 11 is once evacuated through the exhaust pipe 13, and then $N_2$ gas is fed through the gas feed pipe 12 to fill the load lock chamber 11 and the process tube 1. On the other hand the wafer carrier 17 is inserted into the vacuum chamber 15 through the outside shutter, and next the vacuum chamber 15 is evacuated through the exhaust pipe 20 to replace atmospheric air therein with $N_2$ gas. Then $N_2$ gas is fed into the vacuum chamber 15 through the gas feed pipe 19.

In this state, the semiconductor wafers W are conveyed by a convey mechanism 18 from the wafer carrier 17 in the vacuum chamber 15 to the wafer boat 6 in the load lock chamber 11 through the gate valve 14. Then the wafer boat 6 is lifted by the boat elevator 7 into the process tube 1, while the interior of the process tube 1 is tightly closed by the flange 6a.

After the semiconductor devices W are thus loaded into the process tube in $N_2$ gas ambient atmosphere, $N_2$ gas in the process tube 1 is discharged in the same way as above to be replaced by the set treatment gas, and the semiconductor wafers W are subjected to a required treatment. After this treatment, the treatment gas in the process tube 1 is evacuated through the discharge pipe 4, and instead $N_2$ gas is fed through the gas feed pipe 5 to purge the interior of the process tube 1.

In this state the wafer boat 6 is lowered back into the load lock chamber 11 in $N_2$ gas ambient atmosphere by the boat elevator 7, and the treated semiconductor wafers W are discharged through the gate valve 14 by the convey mechanism, 18 into the vacuum chamber 15.

In this arrangement, loading of the semiconductor wafers W into the process tube 1 from the vacuum chamber 15 through the load lock chamber 11, and unloading of the semiconductor wafers W from the process tube 1 along the reverse route can be conducted in ambient atmosphere of $N_2$. The formation of natural oxide films on the semiconductor wafers W can be prevented.

But in this conventional vertical heat treating device of the closed system structure, as the treatment of semiconductor wafers is repeated, in the load lock chamber 11 in ambient atmosphere of an inert gas, such as $N_2$ gas or others, gaseous impurities, such as carbon, are generated, or particles, such as oil mist, dust, etc., are generated, which results in decreases of purity of the inert gas in the load lock chamber 11. There are risks that these impurities may stick to the semiconductor wafers, or may cause chemical contamination, which causes deterioration of characteristics of semiconductor devices, and decreases of yields.

For the prevention of these causes, it is proposed that pure inert gas as the purge gas is incessantly supplied into the load lock chamber 11 through the gas feed pipe 12, while the inert gas in the load lock chamber 11 is exhausted outside together with impurities therein through the exhaust pipe 13, whereby ambient atmosphere of the inert gas in the load lock chamber 11 is kept at high purity. But this method needs flowing a large amount of inert gas, and uneconomically the gas consumption amount is large. Flow of a large amount of inert gas generate particles, and disadvantageously a larger amount of inert gas must be consumed for the removal of the particles.

In view of these problems, this invention has been made and provides a treating device which can maintain ambient atmosphere of inert gas in the load lock chamber at high purity with a minimum feed amount of the inert gas into the load lock chamber, and which is useful to suppress generation of particles and prevent chemical contamination.

To achieve this object, the treating device according to this invention is a treating device for conveying objects to be treated from a wafer boat waiting room into a treatment chamber to subject the objects to be treated to a required treatment, which comprises feeding means for feeding inert gas into the wafer boat waiting room, and retaining an ambient gas atmospheric pressure in the interior of the wafer boat waiting room at a suitable pressure, and gas circulating cleaning system including outlet means for letting out the inert gas from the wafer boat waiting room, a gas cleaning filter for removing gaseous impurity and particulate impurities in the let out inert gas, and return means for returning cleaned inert gas into the wafer boat waiting room.

In the treating device of this structure, inert gas is fed into the load lock chamber by gas feeding means, and an ambient atmospheric pressure of the inert gas in the load lock chamber is retained suitable, and on the other hand the inert gas in the load lock chamber is let out by the gas circulating cleaning system to have gaseous impurity and particulate impurities in the let out gas removed by the gas cleaning filter, and the cleaned inert gas is returned into the load lock chamber. That is, the inert gas in the load lock chamber is repeatedly cleaned and recirculated by the gas circulating cleaning device. Even with treating operations of objects to be treated repeated, the inert gas ambient atmosphere in the load lock chamber can be retained at high purity, and a supply amount of the inert gas into the load lock chamber can be small, which contributes to suppression of generation of particles and preclusion of chemical contamination.

BRIEF DESCRIPTION OF THE DRAWINGS

FIG. 1 is a partial vertical section view of the treating device according to one embodiment of this invention.

FIG. 2 is a partial vertical sectional view of a conventional treating device.

DETAILED DESCRIPTION OF THE PREFERRED EMBODIMENTS

An embodiment of this invention will be explained with reference to the drawings attached hereto. FIG. 1 is a partial vertical sectional view of the vertical heat treating device of the closed system structure according to one embodiment of this invention. This vertical heat treating device is used as oxidation apparatus or a CVD apparatus for forming insulating films on semiconductor wafers as objects to be treated. Common members in FIG. 1 with those in FIG. 2 are represented by common reference numerals not to repeat their explanation.

As shown in FIG. 1, a tightly closed load lock chamber (wafer boat waiting chamber) 11 is disposed on the underside of the process tube 1 which is a treatment chamber. In the load lock chamber 11 there are disposed a wafer boat 6 which can hold a plurality of semiconductor wafers W (e.g., 120 sheets of 6-inch diameter wafers), and a boat elevator 7 for moving the wafer boat 6 up and down into and out of the process tube 1.

A robot chamber 25 as a vacuum chamber is disposed on one side of the load lock chamber 11 continuously through a gate valve 14. A conveying mechanism 18 is disposed in the robot chamber 25. A cassette chamber 27 is disposed on one side of the robot chamber 25 continuously through a gate valve 26. A wafer carrier 17 housing the wafers W can be conveyed into and out of the cassette chamber 27 through an outside shutter 16.

That is, the semiconductor wafers W which have been conveyed in the wafer carrier 17 into the cassette chamber 27 are received one by one through the gate valve 26 by the conveying mechanism 18 in the robot chamber 25 and further conveyed to the wafer boat 6 in the load lock chamber 11 one by one as they are, and the semiconductor wafers W which have been treated are conveyed out along the reverse route.

As means for feeding inert gas ($N_2$ gas in this embodiment) as purge gas into the load lock chamber 11, the robot chamber 25 and the cassette chamber 27, gas feed pipes 12, 28, 29 are provided in upper portions of the respective chambers. Exhaust pipes 13, 30, 31 are provided in lower portions of the respective chambers 11, 25, 27. Valves 13a, 30a, 31a are inserted in the respective exhaust pipes 13, 30, 31. The distal ends of the respective exhaust pipes 13, 30, 31 are collected in a vacuum pump 32. Smaller diameter exhaust pipes 33, 34, 35 are branched from the respective exhaust pipes 33, 34, 31 at the upstream of the respective valves 13a, 30a, 31a. The exhaust pipes 33, 34, 35 are connected to a factory exhaust duct 36 through valves 33a, 34a, 35a.

That is, the interiors of the load lock chamber 11, the robot chamber 25 and the cassette chamber 27 are respectively evacuated to their required vacuum states by the vacuum pump 32 by opening the valves 13a, 30a, 31a. The entire interiors of the respective chambers 11, 25, 27 are placed under ambient atmosphere of inert gas (non-oxygen ambient atmosphere) by incessantly or optionally feeding, e.g., $N_2$ gas respectively through the gas feed pipes 12, 28, 29. Feed amounts of $N_2$ as the purge gas through the gas feed pipes 12, 28, 28, and gas exhaust amounts through the branched exhaust pipes 33, 34, 35 via the-valves 33a, 34a, 35a to the factory exhaust duct 36 can be controlled by respective pressure switches PS and controllers 51 provided in the chambers 11, 25, 27 so that ambient atmospheric pressures of $N_2$ gas in the respective chambers 11, 25, 27 can be retained at their respective suitable positive pressures.

Thus, the convey of the semiconductor wafers W from the interior of the cassette chamber 27 into the process tube 1 through the interiors of the robot chamber 25 and the load lock chamber 11, and the convey of the treated semiconductor wafers W along the reverse route can be conducted in ambient atmosphere of $N_2$ gas (non-oxygen ambient atmosphere) throughout separated from the outside atmosphere. The so-called closed system structure can be provided.

In this invention, a gas circulating cleaning system 40 is provided on the other side of the load lock chamber 11 for retaining the $N_2$ gas ambient atmosphere in the load lock chamber 11 at high purity even after repeated treatments of the semiconductor wafers W in the vertical heat treating device of, e.g., such closed system structure.

The gas circulating cleaning system 40 comprises a gas outlet pipe 41 having one end connected to a lower portion of a side wall of the load lock chamber 11, a fan 42 inserted in the gas outlet pipe, a radiator 50 as gas cooling means, a gas cleaning filter 43 having the entrance 43a connected to the gas outlet pipe 41, and a gas return pipe 44 having one end connected to the exit of gas cleaning filter 43 and the other end connected to an upper portion of the side wall of the load lock chamber 11. In the gas outlet pipe 41 and the gas return pipe 44, valves 45, 46 are disposed respectively near the entrance 43a and the exit of the gas cleaning filter 43. The gas cleaning filter 43 is disposed upright with the entrance 43a positioned upper and the exit 43b positioned lower.

The gas cleaning filter 43 comprises a filter 43e of a metal getter of zirconia or others for chemicals use, and filters 43d, 43d of metal, such as stainless steel or others, for particles use which (filters 43e ; 43d, 43d) are incorporated in one casing 43c, and highly heat-resistantly is all made of metal. The metal filter 43e for chemicals use absorbs gaseous impurity (water, oxygen, hydrocarbon, etc.) in the gas let in through the entrance 43a , and the filters 43e for particles filter and catch for removal particulate impurities (particles, as of dust, etc.). The filters for chemicals use, 43e on the side of the entrance 43a has a roughness of, e.g., 0.5 micron, and the filters for particles use 43d, 43d have a roughness of, e.g., 0.01 micron. The gas cleaning filter 43 can decrease impurities in the $N_2$ gas to below 1 particle (0.01 micron) per 1 cubic foot of the $N_2$ gas, and can clean 20–30 liters of the $N_2$ gas per minute. A gas circulation rate is 1–20 liter/min., preferably 2–10 liter/min.

For the purposes of eliminating only chemicals, only the chemical filter can be used therefor.

The operation of the treating device with this gas circulating and cleaning system 40 will be explained. The interiors of the load lock chamber 11 and the robot chamber 25 are evacuated by the vacuum pump 32 through their respective exhaust pipes 13, 30, and when their interiors are in required vacuum states, an inert gas, $N_2$ gas is fed through the gas feed pipes 12, 28 to place the interiors of the respective chambers including the interior of the process tube 1 as well in ambient atmosphere of $N_2$ gas (non-oxygen ambient atmosphere). $N_2$ gas is continuously fed into the respective chambers 11, 25, while the $N_2$ gas is exhausted bit by bit from the respective chambers to the factory exhaust duct through the branched exhaust pipes 33, 34, and the valves 33a, 34a to maintain an ambient atmospheric pressures of the respective chambers at their respective suitable positive pressures.

Here when the wafer carrier 17 holding semiconductor wafers W is moved into the cassette chamber 27 through the gate valve 26, the air in the cassette chamber 27 is evacuated through the exhaust pipe 31 by the vacuum pump 32, and instead $N_2$ gas is fed into the cassette chamber 27 through the gas feed pipe 29 while the $N_2$ gas is exhausted bit by bit to the factory exhaust duct 36 through the branched exhaust pipe 35 and the valve 35a, whereby the interior of the cassette chamber 27 is also replaced by $N_2$ gas ambient atmosphere.

With the entire interiors of all the chambers placed in $N_2$ gas ambient atmosphere, the conveying mechanism 18 in the robot chamber 25 receives the semiconductor wafers W in the wafer carrier 17 one by one through the gate valve 26 and further conveys the semiconductor wafers W one by one to the wafer boat 6 in the load lock chamber 11 through the gate valve 14. Then the wafer boat 6 is lifted by the boat elevator 7 into the process tube 1, and the interior of the process tube 1 is tightly closed by the flange 6a.

Then, wafer boat 6 is lowered by the boat elevator 7 back into the load lock chamber 11, and the treated semiconductor wafers W in the wafer boat 6 are taken out by the conveying mechanism 18 through the gate valve 14 and conveyed into the robot chamber 25. Then the treated semiconductor wafers W are carried to a next treatment step, or are housed in the wafer carrier 17 in the cassette chamber 27 to be taken outside.

Thus semiconductor wafers W are conveyed from the cassette chamber into the process tube 1 through the robot chamber 25 and the load lock chamber 11, and are conveyed out oppositely along the route completely in $N_2$ gas ambient atmosphere, whereby the semiconductor wafers W can be subjected to a required treatment while kept from the formation of natural oxide films thereon.

On the other hand in this treating operation of the semiconductor wafers W, the fan of the gas circulating cleaning system 40 is driven to draw out the $N_2$ gas from the lower portion of the load lock chamber 11 into the gas outlet pipe 41, and the $N_2$ gas is cooled by the radiator 50 and passed through the gas cleaning filter 43. Gaseous impurity (water, oxygen hydrocarbon, etc.) in the $N_2$ gas is adsorbed by the filter 43e for chemicals use in the gas cleaning filter 43, and particulate impurities (particles as of dust, etc.) are filtered and caught for removal by the filters 43d, 43d for particles use. Thus cleaned $N_2$ gas is returned to the upper portion of the interior of the load lock chamber 11 through the gas return pipe 44. That is, the $N_2$ gas in the load lock chamber 11 is repeatedly cleaned and recirculated by the gas circulating cleaning system 40. At this time, a larger $N_2$ amount is circulated than an exhausted $N_2$ gas amount through the exhaust pipe 13.

Thus even in the treating device of the above-described closed system structure $N_2$ gas ambient atmosphere can be always maintained at high purity because in a treating operation of semiconductor wafers W gaseous impurity, such as carbon, etc., and particulate impurities, such as oil mist, dust, etc., generated in the N₂ gas ambient atmosphere in the load lock chamber 11 can be removed by the gas circulating cleaning system 40.

As results, it can be precluded that impurities stick to the semiconductor wafers or chemically react (cause chemical contamination), and characteristics and yields of semiconductor devices can be improved. Achievement of the treating device can be improved. It becomes less necessary to discharge the N₂ gas fed into the load lock chamber 11 as purge gas for the purpose of discharging impurities, and a consumption amount of the N₂ gas can be drastically decreased. Furthermore, it is not necessary to cause a large amount of N₂ gas to flow into the load lock chamber 11, and generation of particles can be accordingly suppressed.

In the above-described embodiment, the metal getter built in the gas cleaning filter 43, as the filter for chemicals use, of the gas circulating and cleaning system 40 may be replaced by a getter of a suitable material, and the metal getter is re-usable.

The treating device according to the above-described embodiment is used as an oxidation apparatus or CVD apparatus for forming insulating films on semiconductor wafers W but is not limited to kinds of objects to be treated and kinds of treatments. It is needless to say that the treating device can be used in other treatments. Depending on kinds of treatments, inert gas other than N₂ gas may be fed.

As treatment gases sealed in the process tube, in the case, for example, that the treating device is used as a CVD apparatus, SiH₄ gas is used for the formation of polysilicon thin film, and NH₄ gas and SiH₂Cl₂ gas are used for the formation of silicon nitride film. A heating power of the heater 2 in the process tube may be determined depending on a treatment. For example, as an oxidation apparatus, the heater 2 is arranged to have a heating temperature of 800–1200° C. and have a heating temperature of 500–1000° C. as a CVD apparatus.

The treating device of this invention having the above-described structure can retain ambient atmosphere of inert gas in the load lock chamber (wafer boat waiting room) always at high purity by the gas circulating cleaning system. A consumption amount (exhaust amount) of the inert gas can be small, which much contributes to suppression of generation of particles and preclusion of chemical contamination. The treating device can have high achievement and enjoy economic advantageous effects.

What is claimed is:

1. A treating device for conveying objects to be treated from a wafer boat waiting room into a treatment chamber to subject the objects to be treated to a required treatment, said device comprising:

feeding means for feeding inert gas into the wafer boat waiting room, and retaining an ambient gas atmospheric pressure in the interior of the wafer boat waiting room at a suitable pressure; and gas circulating cleaning means including outlet means for letting out the inert gas from the wafer boat waiting room, a gas cleaning filter for removing gaseous impurity and particulate impurities in the let out inert gas, and return means for returning cleaned inert gas into the wafer boat waiting room.

2. The treating device according to claim 1, further comprising cooling means for cooling the inert gas let out into the outlet means.

3. The treating device according to claim 1, wherein said gas cleaning filter is a combination of a filter for chemicals and filters for particles made of metal or ceramics.

4. The treating device according to claim 3, wherein a first of said filters for particles has about a 0.5 μm roughness and is disposed on the side of inflow of the cleaning filter, and a second of said filters for particles has about a 0.01 μm roughness and is disposed on the side of outflow of the cleaning filter, and said filter for chemicals is disposed between both filters for particles.

5. The treating device according to claim 1, wherein a return flow amount of the inert gas is larger than an exhausted amount of the inert gas from the wafer boat waiting chamber.

6. The treating device according to claim 1, wherein said gas cleaning filter comprise a filter for chemicals.

7. The treating device according to claim 6, wherein said filter for chemicals includes a metal getter of zirconia.

8. The treating device according to claim 3, wherein said filter for chemicals includes a metal getter of zirconia.

9. The treating device according to claim 3, wherein said filter for chemicals is disposed between a pair of filters for particles.

* * * * *